United States Patent [19]
Williams et al.

[11] Patent Number: 5,378,298
[45] Date of Patent: Jan. 3, 1995

[54] RADIATION SENSITIVE ADHESIVE COMPOSITION AND METHOD OF PHOTOIMAGING SAME

[75] Inventors: Melanie Williams, Deerfield Beach; Thomas J. Swirbel, Davie, both of Fla.

[73] Assignee: Motorola, Inc., Schaumburg, Ill.

[21] Appl. No.: 69,798

[22] Filed: Jun. 1, 1993

[51] Int. Cl.⁶ ............................................. B03C 1/94
[52] U.S. Cl. ............................ 156/275.5; 156/275.7; 430/270
[58] Field of Search .................... 156/277, 275.5, 275.7; 430/269, 270, 311

[56] References Cited

U.S. PATENT DOCUMENTS

| | | | |
|---|---|---|---|
| 3,469,982 | 9/1969 | Celeste . | |
| 3,909,930 | 10/1975 | Gurtler | 29/592 |
| 3,926,641 | 12/1975 | Rosen | 156/275.5 |
| 4,054,483 | 10/1977 | Peiffer | 156/280 |
| 4,157,407 | 6/1979 | Peiffer | 156/275.5 |
| 4,222,635 | 9/1980 | Jülke | 156/275.5 |
| 4,239,077 | 12/1980 | Dixon et al. | 156/272 |
| 4,390,614 | 6/1983 | Peck | 430/252 |
| 4,424,089 | 1/1984 | Sullivan | 156/275.5 |
| 4,601,560 | 7/1986 | Isohata et al. | 353/122 |
| 4,966,827 | 10/1990 | Sullivan | 430/270 |
| 5,263,111 | 11/1993 | Nurse et al. | 385/130 |

FOREIGN PATENT DOCUMENTS 45100  1/1992  Japan ........................ 156/275.5

Primary Examiner—David A. Simmons
Attorney, Agent, or Firm—Motorola, Inc., Patent Department; Dale W. Dorinski

[57] ABSTRACT

A method of photodelineating an adhesive on a substrate. The first step (10) is to coat the substrate with a layer of photopolymeric adhesive, typically spin coated. The adhesive is then briefly 'soft baked' at a moderate temperature to set it (20). Portions of the adhesive are then selectively exposed to actinic radiation to partially cure them, while other portions are not exposed (30). A photomask is used to selectively expose the photopolymeric adhesive to ultraviolet light at an intensity and for a time sufficient to partially cure the photopolymeric adhesive. The adhesive is developed (40) to selectively remove those portions that were not exposed to radiation, usually in an appropriate solvent, creating a pattern in the adhesive. The developed adhesive pattern is then heated for a time and temperature sufficient to completely cure it (50).

11 Claims, 1 Drawing Sheet

RADIATION SENSITIVE ADHESIVE COMPOSITION AND METHOD OF PHOTOIMAGINGSAME

TECHNICAL FIELD

This invention relates in general to a radiation sensitive composition and a method of producing an image in the composition, and more particularly to a photopolymeric adhesive and a method of photoimaging the adhesive.

BACKGROUND

Adhesives find use in an unending variety of applications, and are an integral part of our daily lives. A good adhesive must have many properties, some of which are mutually exclusive, and therefore require compromise in selection. For example, it must adhere tenaciously to the substrate upon which it is to be bonded, it must be able to be converted from a 'non-adhesive' state to an adhesive state, it must be able to be properly applied or located on the substrate of choice, and must meet numerous other criteria such as cost, environmental resistance, toxicity, reliability, shear strength, peel strength, color, viscosity, etc. Of these, we are concerned here with the ability to be properly applied or located on the substrate of choice and the ability to be converted from a 'non-adhesive' state to an adhesive state.

Conventional adhesives are applied in myriad ways, for example, dispensing, pouring, roller coating, spraying, dipping, painting, stenciling, and electrostatic coating. Each of these are performed manually or by machine. Those skilled in the art will appreciate that each technique poses problems in uniform and accurate application, and can be messy. Creation of complex patterns of adhesive is difficult, and is typically achieved by stenciling or dispensing. Both of these methods have a limit to their usefulness when trying to achieve fine resolution and accurate placement of the adhesive.

Conventional adhesives, such as ultraviolet (UV) light-curable adhesives, cannot be patterned with existing photodelineation methods. To do so would completely cure the adhesive, thereby rendering it useless as an adhesive. The UV adhesives must also be fully exposed to be cured, which requires that either the part to be bonded is very small, or it is transparent to UV light, so that the adhesive can be cured under the part. This severely limits their use.

Photoresists have been used as masks to create very fine patterns on printed circuit boards and semiconductor wafers. These polymers are typically applied as a dry film or a liquid, and are selectively exposed, and developed. While these materials are widely used in the electronics industry, they suffer from poor adhesion to the substrate and cannot be used as true adhesives to bond articles together due to the need to irradiate the adhesive to cure it. For example, Gurtler, in U.S. Pat. No. 3,909,930 describes the use of RISTON photoresist to create a cavity in a liquid crystal display. Those skilled in the art will appreciate that while RISTON is an excellent photoresist for masking and etching circuit patterns, it can not be used as an adhesive due to the marginal adhesion to the substrate. Sullivan, in U.S. Pat. No. 4,966,827 describes a cumbersome method to overcome the stated poor adhesion of dry film resists. Further, the resist must be fully and uniformly exposed by the light for proper results, thereby precluding its use as an adhesive to bond two opaque materials together. For example, RISTON cannot be used to adhesively bond a metal heat sink to a printed circuit board, because it is a very poor adhesive, and because the light cannot get through the opaque metal to initiate the curing photoreaction. Attempts to thermally cure these types of resists produce minimal, if any, adhesive bonding.

Therefore, a need has existed for a material and a method to produce fine line, high resolution patterns of adhesives to bond opaque materials together.

SUMMARY OF THE INVENTION

Briefly, according to the invention, there is provided a method of photodelineating an adhesive on a substrate. The substrate is first coated with a layer of photopolymeric adhesive, and heated at a moderate temperature for a brief time. Portions of the adhesive are selectively exposed to actinic radiation to partially cure them, while other portions are not exposed. The adhesive is developed to selectively remove those portions that were not exposed to radiation, thereby creating a pattern in the adhesive. The developed adhesive pattern is then heated to completely cure it.

In an alternate embodiment of the invention, the photopolymeric adhesive is spin coated onto a substrate. A 'soft bake' at a moderate temperature for a brief time is performed to 'set' the adhesive. A photomask is used to selectively expose the photopolymeric adhesive to ultraviolet light at an intensity and for a time sufficient to partially cure the photopolymeric adhesive. The adhesive is developed in a suitable solvent to remove the adhesive that was not selectively exposed, thereby creating a pattern. The pattern is further cured by heating it for a time and temperature sufficient to fully cure the adhesive.

DETAILED DESCRIPTION OF THE PREFERRED EMBODIMENT

Figure 1:
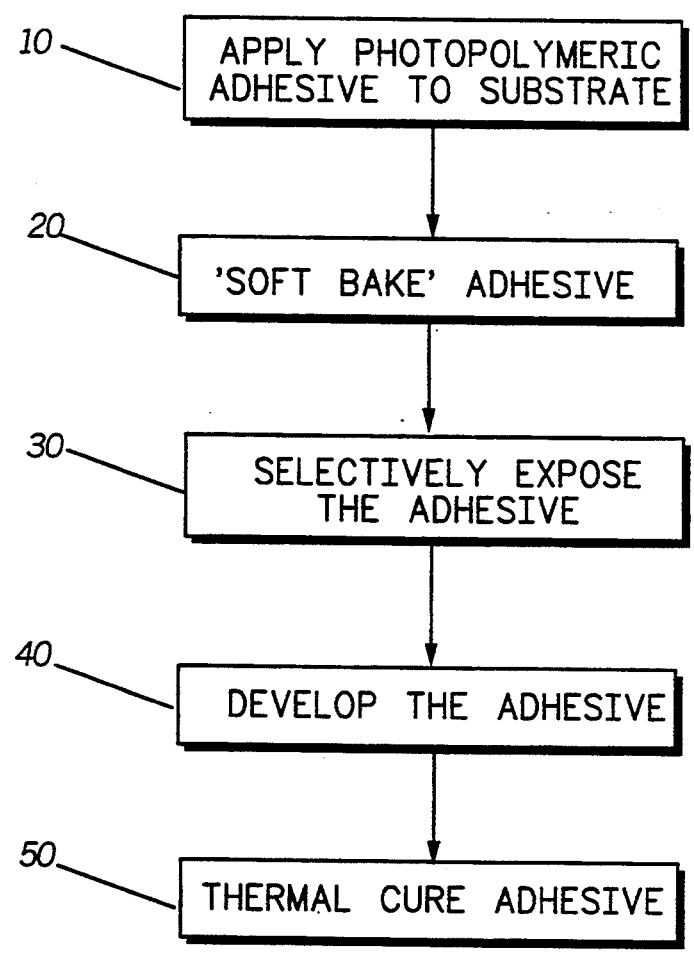
FIG. 1 is a process flow in accordance with the invention.

While the specification concludes with claims defining the features of the invention that are regarded as novel, it is believed that the invention will be better understood from a consideration of the following description in conjunction with the sole drawing figure, in which like reference numerals are carried forward.

The main thrust of this invention is to obtain adhesive compositions suitable for use as a photoimageable adhesive, and methods for imaging these adhesives. A particularly advantageous embodiment provides a composition and a method of patterning an adhesive that can be used for tightly bonding two opaque materials together. The preferred adhesive composition is a modified commercial formulation which, when processed in a particular way, produces the desired result of UV imaging and thermal curing, and has the requisite adhesive bonding and thixotropic properties. The formulation consists of an UV thermally active resin that is UV photoactive. Typically, the resin contains prepolymers and monomers, a UV active catalyst to polymerize the resin, and heat active catalysts for the final cure. The catalysts can also be dual function catalysts. These types of formulations harden and cure upon exposure to UV light and then become fully cured upon exposure to heat. Alternatively, a single photoactive catalyst, or a UV active resin, susceptible to varying amounts of radiation can be employed.

Referring now to FIG. 1, a process flow for the adhesive is disclosed. In step 10, a UV curable adhesive, such as the family of acrylic adhesives, typified by LOCTITE UV 352 from Loctite Corporation, is coated onto a substrate. Other types of adhesives might also be suitable, for example adhesives curable by electron beams, visible or infrared light, x-rays, etc. The substrate can be any number of materials, and is used herein to designate the member upon which the adhesive is desired to be patterned. The adhesive is preferably spin coated onto the substrate in order to create a thin, uniform layer of adhesive of the desired and requisite thickness. At this point, the adhesive is a viscous liquid, and must be handled carefully.

Step 20 is a partial curing of the adhesive coating. For the particular adhesive described herein, this step has been found to be critical in the successful implementation of the process. One way to partially cure the adhesive is to 'soft bake' it. If the soft bake step is omitted, the adhesive does not cure in the desired manner, and does not photoimage properly. The exact mechanisms occurring during soft bake are not fully understood, but it is postulated that the heat causes removal of various chemicals that affect the curing mechanism, or acts as a catalyst to initiate the curing reaction, and "partially" cures the adhesive. The range of soft-bake conditions found to be workable with the selected UV adhesive are between 40° C. and 85° C. for between 1 and 15 minutes, with 5 minutes at 55° C. the preferred conditions. Other methods of partially curing might be substituted for the soft bake, such as exposure to low levels of UV radiation.

The adhesive is then masked with a phototool and imaged in step 30. The phototool can assume many forms, from a crude cardboard mask to a sophisticated glass phototool. The goal is to selectively expose portions of the thin adhesive coating to UV light in order to partially cure the adhesive. The phototool must have areas that can pass the light with minimal attenuation, such as holes in a mask or transparent areas in a glass tool. Other areas must obstruct the light from reaching the adhesive, and are typically opaque. In the mask, these would be solid portions, and would be black portions on a glass phototool. Any manner of achieving this selective exposure will deliver equivalent results. For example, the phototool could be placed directly on the adhesive, slightly above the adhesive, or at a distance from the adhesive, or it may be eliminated entirely by using direct imaging. Direct imaging uses a moving right beam, such as a laser, to directly expose portions of the adhesive. This technology finds wide use in exposing dry film photoresists, and can be employed here. In any case, the time and intensity of exposure is dependent on the particular material and thickness of the coating, and should be of such level as to partially, but not completely, cure the adhesive. If it is too high, the adhesive will cure too much and cannot be properly further cured. Too little exposure will not allow the image to be properly developed. Exposure intensities between 500 and 2000 millijoules were found effective, with 1500 millijoules being preferred. Collimated ultraviolet light at a wavelength of about 365 nm is best for the particular adhesive described here. At this point, a latent image is present in the adhesive. That is, the adhesive has been selectively exposed (polymerized), but the image cannot be seen with the naked eye.

The next step (40) is to develop the latent image. Typically, one or more suitable solvents are used to dissolve away the unexposed (unpolymerized) portions of the adhesive. Solvents such as water, alcohol, xylene, chlorinated hydrocarbons, ethers, esters, and mixtures thereof are typically used. The solvent is chosen such that it dissolves the monomeric resin, but does not attack or degrade the exposed resin. The image can also be developed in other ways, such as plasma developing, where the uncured adhesive is removed by plasma ashing. After developing, the desired image or pattern can be seen in the adhesive, because unwanted portions have been removed. The adhesive is now partially cured, and is dry to the touch, but not fully cured. This is commonly referred to as a 'B-Stage' of material. The photoinitiators have reacted with the adhesive and converted it from a liquid state to a solid, but further cure is still available.

The final step (50) is the attachment of the desired second material, such as an electronic component, another substrate, or other desired part, onto the B-Stage adhesive. Since the adhesive is still somewhat tacky, this is easily performed. The adhesive is completely cured by heating at a time and temperature sufficient to cure and securely bond the second material to the first material. Temperatures between 125° and 150° C. were found effective, with 145° C. for 1-2 hours being preferred. This treatment converts the adhesive from a B-Stage material to a C-Stage material. Other methods of fully curing the adhesive such as flood exposure at high levels of UV energy might also be useful.

EXAMPLE 1

LOCTITE 352 adhesive was spin coated onto a polyester substrate by spinning the substrate at 5000 revolutions per minute for 30 seconds using a spin coater made for semiconductor wafers. The viscosity of the adhesive prior to spin coating was about 20,000 centipoise. The substrate with the coated adhesive was soft baked at 55° C. for 5 minutes. After soft baking, the adhesive was masked with a glass phototool and exposed to collimated ultraviolet light at 365 nm. The light intensity was 1500 millijoules. After exposure, the latent image in the adhesive was developed for approximately 1 minute in n-butyl acetate, and then rinsed in xylene, followed by deionized water. The resulting pattern was between 10 and 12 microns thick, and features as small as 0.025 mm could be discerned. A second polyester substrate was placed onto the adhesive, and the assembly was cured with heat and pressure in a 145° C. oven for 1 hour. The composite was found to be tightly bonded after the process, and exhibited 20 lbs of adhesion when tested in the shear mode. All adhesion tests were performed on a 6×25 mm section of the substrates.

EXAMPLE 2

LOCTITE 352 adhesive was spin coated onto a polyester substrate by spinning the substrate at 5000 revolutions per minute for 30 seconds using a spin coater made for semiconductor wafers. The viscosity of the adhesive prior to spin coating was about 20,000 centipoise. The adhesive was masked with a glass phototool and exposed to collimated ultraviolet light at 365 nm. The light intensity was 1500 millijoules. After exposure, the latent image in the adhesive was developed for approximately 1 minute in n-butyl acetate, and then rinsed in xylene, followed by deionized water. The resulting pattern was poorly developed, and had poorly discernible features. A second polyester substrate wets placed onto the adhesive, and the assembly was cured with heat arid pressure in a 145° C. oven for 1 hour. The composite was found to be tightly bonded after the process, and exhibited 20 lbs of adhesion when tested in a combination shear/tension mode.

EXAMPLE 3

LOCTITE 352 adhesive was coated onto a polyester substrate by forming a thin layer on the substrate with a blade. The viscosity of the adhesive was about 20,000 centipoise. The adhesive was masked with a glass phototool and exposed to collimated ultraviolet light at 365 nm and 1500 millijoules. After exposure, the latent image was developed in n-butyl acetate, and then rinsed in xylene, followed by deionized water. The resulting pattern was poorly developed, and had poorly discernible features. A second polyester substrate was placed onto the adhesive, and the assembly was cured with heat and pressure in a 145° C. oven for 1 hour. The composite was found to be poorly bonded after the process, and exhibited 2 lbs of adhesion when tested in a shear mode.

EXAMPLE 4

LOCTITE 352 adhesive was coated onto a polyester substrate by forming a thin layer on the substrate with a blade. The viscosity of the adhesive was about 20,000 centipoise. The substrate with the coated adhesive was soft baked at 55° C. for 5 minutes. After soft baking, the adhesive was masked with a glass phototool and exposed to collimated ultraviolet light at 365 nm and 1500 millijoules. After exposure, the latent image was developed. The resulting pattern was poorly developed, and had poorly discernible features. A second polyester substrate was; placed onto the adhesive, and the assembly was cured with heat and pressure in a 145° C. oven for 1-2 hours. The composite was found to be poorly bonded after the process, and exhibited 20 lbs of adhesion when tested in a shear mode.

EXAMPLE 5

RISTON 318 R photoresist was coated onto a polyester substrate by laminating under heat and pressure. The photoresist was masked with a glass phototool and exposed to collimated ultraviolet light at 365 nm. After exposure, the latent image was developed. The resulting pattern exhibited discernible features as small as 0.05 mm. A second polyester substrate was; placed onto the adhesive, and the assembly was cured with heat and pressure in a 145° C. oven for 1-2 hours. The composite was found to be poorly bonded after the process, and exhibited 7 lbs of adhesion when tested in a shear mode.

| Example | Application | Soft Bake/ Exp. Energy | Adhesion (Shear) | Contrast |
| --- | --- | --- | --- | --- |
| 1 | Spin Coat (5K RPM) | 55° C. for 5 minutes 1500 MJ | 20 lbs | Very Good - at least 1 mil Resolution |
| 2 | Spin Coat (5K RPM) | None/ 1500 mJ | 20 lbs | Poor |
| 3 | Butter Coat | None/ 15000 mJ | 2 lbs | Good |
| 4 | Butter Coat | 55° C. for 5 minutes 1500 MJ | 20 lbs | Poor |
| 5 | Riston 318R | None | 7 lbs | Fair |

In an alternate embodiment of the invention, a colloidally dispersed electrically conductive dispersion is added to the above disclosed adhesive composition to impart electrical conductivity to the patterned adhesive to obtain a conductive adhesive. Seventy to ninety weight percent of micron or submicron sized particles of metal or metal coated spheres such as polymer, glass or silica, are dispersed n the adhesive. Conductive particles dispersed in a volatile solvent containing a volatile surfactant consisting of a volatile solvent which is removed during spin coating to obtain a uniformly dispersed colloidal suspension with the desired thickness. Graphite or metals such as copper, nickel, gold, silver, platinum, and rhodium can be used. The conductive adhesive formulation is imaged at extended exposure times to overcome the effects of scattered radiation from the presence of the metal particles.

The composition and method, according to the invention, provide the long desired ability to accurately create a high resolution pattern of adhesive material and bond two opaque substrates together, something heretofore unavailable. While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of photodelineating an adhesive, comprising the steps of:
   coating a substrate with a layer of photopolymeric adhesive;
   soft baking the photopolymeric adhesive;
   selectively exposing only portions of the adhesive to actinic radiation to partially cure said portions;
   developing the adhesive to selectively remove those portions that were not exposed, thereby creating a pattern in the adhesive; and
   heating the developed adhesive to completely cure it.

2. The method as described in claim 1, wherein the step of soft baking comprises heating the photopolymeric adhesive at a temperature between about 40° C. and about 85° C. for between about 1 and about 15 minutes.

3. A method of photodelineating an adhesive, comprising the steps off:
   coating a substrate with a layer of photopolymeric adhesive;
   treating the layer of photopolymeric adhesive so as to partially cure the layer;
   selectively exposing only portions of the partially cured layer of photopolymeric adhesive to actinic radiation to further cure said portions;
   developing the layer of photopolymeric adhesive to remove those portions that were not selectively exposed to actinic radiation, thereby creating a pattern in the layer of photopolymeric adhesive; and
   fully curing the developed layer of photopolymeric adhesive.

4. The method as described in claim 1, wherein the photopolymeric adhesive is not a photoresist.

5. A method of depositing an adhesive in a selected pattern, comprising the steps of:
   spin coating a layer of a photopolymeric adhesive on a substrate;
   soft baking the photopolymeric adhesive;

temporarily applying a photomask over the photopolymeric adhesive;

selectively exposing the photopolymeric adhesive to ultraviolet light through the photomask, in a manner and for a time sufficient to partially cure the photopolymeric adhesive;

developing the selectively exposed adhesive in a suitable solvent to remove the adhesive that was not selectively exposed, thereby creating a pattern in the adhesive; and further curing the adhesive pattern by heating it for a time and temperature sufficient to fully cure the adhesive.

6. A method of depositing an adhesive in a selected pattern, comprising the steps of:

spin coating a layer of a photopolymeric adhesive on a first substrate;

soft baking the layer of photopolymeric adhesive;

temporarily applying a photomask over the layer of photopolymeric adhesive;

exposing portions of the layer of photopolymeric adhesive to ultraviolet light through the photomask, in a manner and for a time sufficient to partially cure the exposed portions of photopolymeric adhesive;

developing the layer of photopolymeric adhesive in a suitable solvent to remove the photopolymeric adhesive that was not exposed to ultraviolet light, thereby creating a pattern in the adhesive;

adding a second substrate on the developed layer of photopolymeric adhesive;

further curing the developed layer of photopolymeric adhesive by heating it for a time and temperature sufficient to fully cure it and adhesively bond the second substrate to the first substrate.

7. A method of depositing an adhesive in a selected pattern, comprising the following steps in the order named:

A) spin coating a layer of a UV curable adhesive on a substrate;

B) heating the UV curable adhesive at a temperature between about 40° C. and about 85° C. for between about 1 and about 15 minutes;

C) temporarily masking portions of the UV curable adhesive with an opaque material, while leaving other portions exposed;

D) selectively exposing the UV curable adhesive to ultraviolet light through the mask, in a manner and for a time sufficient to partially cure the exposed portions of the UV curable adhesive, thereby reacting the adhesive to a B-Stage;

E) developing the UV curable adhesive in a suitable solvent to remove the portions that were not selectively exposed, thereby creating a pattern in the UV curable adhesive;

F) adding another substrate on the developed UV curable adhesive; and

G) further curing the B-Stage adhesive pattern by heating it for a time and temperature sufficient to full cure the adhesive, converting it from B-Stage to C-Stage, and adhesively bonding the second substrate to the first substrate.

8. The method as described in claim 7, wherein the UV curable adhesive is an acrylic adhesive.

9. The method as described in claim 7, wherein step (B) comprises heating at 55° C.

10. The method as described in claim 7, wherein step (D) comprises exposing the adhesive to between about 500 and about 2000 millijoules of ultraviolet light.

11. The method as described in claim 7, wherein the suitable solvent in step (E) comprises n-butyl acetate.

* * * * *